(12) United States Patent
Hondo (10) Patent No.: US 11,688,669 B2
(45) Date of Patent: Jun. 27, 2023

(54) WIRING SUBSTRATE

(71) Applicant: SHINKO ELECTRIC INDUSTRIES CO., LTD., Nagano (JP)

(72) Inventor: Satoshi Hondo, Nagano (JP)

(73) Assignee: SHINKO ELECTRIC INDUSTRIES CO.. LTD., Nagano (JP)

( * ) Notice: Subject to any disclaimer, the term of this patent is extended or adjusted under 35 U.S.C. 154(b) by 79 days.

(21) Appl. No.: 17/447,608

(22) Filed: Sep. 14, 2021

(65) Prior Publication Data

US 2022/0093493 A1 Mar. 24, 2022

(30) Foreign Application Priority Data

Sep. 18, 2020 (JP) .................................. 2020-157679

(51) Int. Cl.
*H01L 23/492* (2006.01)
*H01L 23/00* (2006.01)
*H01L 23/498* (2006.01)

(52) U.S. Cl.
CPC ...... *H01L 23/492* (2013.01); *H01L 23/49805* (2013.01); *H01L 23/562* (2013.01); *H01L 24/02* (2013.01)

(58) Field of Classification Search
CPC ............. H01L 23/492; H01L 23/49805; H01L 23/562; H01L 24/02
See application file for complete search history.

(56) References Cited

U.S. PATENT DOCUMENTS

| 8,232,641 | B2 | 7/2012 | Ozawa et al. | |
| 9,349,700 | B2* | 5/2016 | Hsieh | H01L 24/03 |
| 2006/0076639 | A1* | 4/2006 | Lypen | H01L 29/872 257/481 |
| 2007/0120216 | A1* | 5/2007 | Brigante | H01L 24/48 438/597 |
| 2007/0205508 | A1* | 9/2007 | Hsia | H01L 24/05 257/734 |
| 2009/0275163 | A1* | 11/2009 | Lacey | B81C 1/00333 438/51 |
| 2010/0201000 | A1* | 8/2010 | Antol | H01L 24/05 257/784 |
| 2010/0237500 | A1* | 9/2010 | Kwon | H01L 23/49811 257/E21.59 |
| 2014/0054742 | A1* | 2/2014 | Katti | H01L 23/5223 257/503 |
| 2014/0319695 | A1* | 10/2014 | Hsieh | H01L 24/03 257/774 |

(Continued)

FOREIGN PATENT DOCUMENTS

JP 2010-272681 12/2010

*Primary Examiner* — Nathan W Ha
(74) *Attorney, Agent, or Firm* — IPUSA, PLLC (57) ABSTRACT

A wiring substrate includes a first insulating layer, a pad on a surface of the first insulating layer, a reinforcement wiring pattern in or on the surface of the first insulating layer, and a second insulating layer on the surface of the first insulating layer. The reinforcement wiring pattern surrounds the pad without contacting the pad in a plan view. The second insulating layer includes an opening in which the pad is exposed without contacting the second insulating layer. The second insulating layer includes an inner side surface defining the opening. The inner side surface is on the reinforcement wiring pattern.

15 Claims, 9 Drawing Sheets

(56) References Cited

U.S. PATENT DOCUMENTS

| | | | |
|---|---|---|---|
| 2015/0137388 A1* | 5/2015 | Kim | H01L 23/481 |
| | | | 257/774 |
| 2017/0365564 A1* | 12/2017 | Yu | H01L 24/13 |
| 2019/0393263 A1* | 12/2019 | Kuo | H01L 33/507 |
| 2020/0066548 A1* | 2/2020 | Chen | H01L 24/11 |
| 2020/0083198 A1* | 3/2020 | Kuo | H01L 33/46 |
| 2020/0273773 A1* | 8/2020 | Wan | H01L 21/568 |
| 2020/0321690 A1* | 10/2020 | Paulotto | H01Q 1/22 |
| 2021/0098399 A1* | 4/2021 | Huang | H01L 24/03 |
| 2021/0351142 A1* | 11/2021 | Yeh | H01L 21/02063 |
| 2022/0020709 A1* | 1/2022 | Li | H01L 24/05 |
| 2022/0375767 A1* | 11/2022 | Chen | H01L 24/19 |

\* cited by examiner

WIRING SUBSTRATE

CROSS-REFERENCE TO RELATED APPLICATION

This application is based upon and claims priority to Japanese patent application No. 2020-157679, filed on Sep. 18, 2020, the entire contents of which are incorporated herein by reference.

FIELD

A certain aspect of the embodiment discussed herein is related to wiring substrates.

BACKGROUND

The wiring substrate includes a pad exposed in an opening provided in the outermost insulating layer. This pad serves as an external connection terminal for electrical connection with a semiconductor chip, another substrate or the like. Structures of forming pads on a wiring substrate include non-solder mask defined (NSMD) structure, in which the opening is larger than the pad, and solder mask defined (SMD) structure, in which the opening is smaller than the pad (see Japanese Laid-open patent publication No. 2010-272681).

SUMMARY

According to an aspect of the invention, a wiring substrate includes a first insulating layer, a pad on a surface of the first insulating layer, a reinforcement wiring pattern in or on the surface of the first insulating layer, and a second insulating layer on the surface of the first insulating layer. The reinforcement wiring pattern surrounds the pad without contacting the pad in a plan view. The second insulating layer includes an opening in which the pad is exposed without contacting the second insulating layer. The second insulating layer includes an inner side surface defining the opening. The inner side surface is on the reinforcement wiring pattern.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

According to a wiring substrate of NSMD structure, however, when high temperature treatment such as reflow soldering is performed, a stress occurs at the interface between a first insulating layer including an opening that exposes a pad and a second insulating layer under the first insulating layer because of a difference in the coefficient of thermal expansion between the first and the second insulating layer, so that a crack may be generated at the interface. The generated crack reduces the reliability of insulation in the wiring substrate.

According to an aspect of the present invention, it is possible to ensure insulation reliability in a wiring substrate of NSMD structure.

An embodiment of the present invention is described below with reference to the accompanying drawings. The same elements are referred to using the same reference numerals, and a duplicate description thereof may be omitted.

Figure 1A:
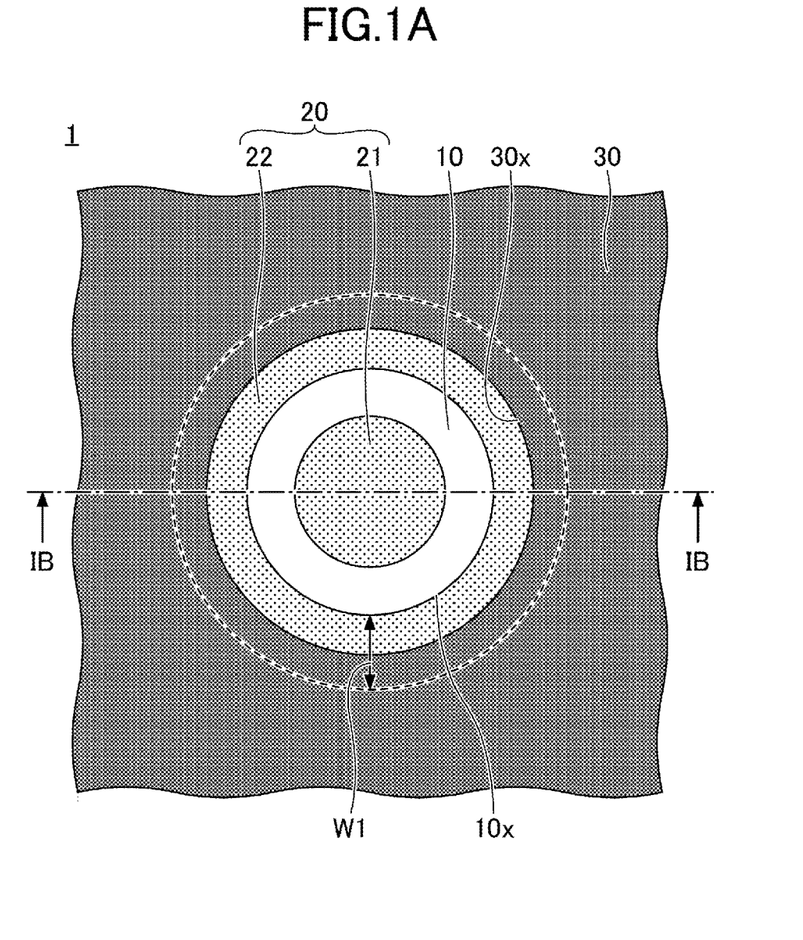
FIGS. 1A and 1B are diagrams illustrating a wiring substrate according to an embodiment.
Figure 1B:
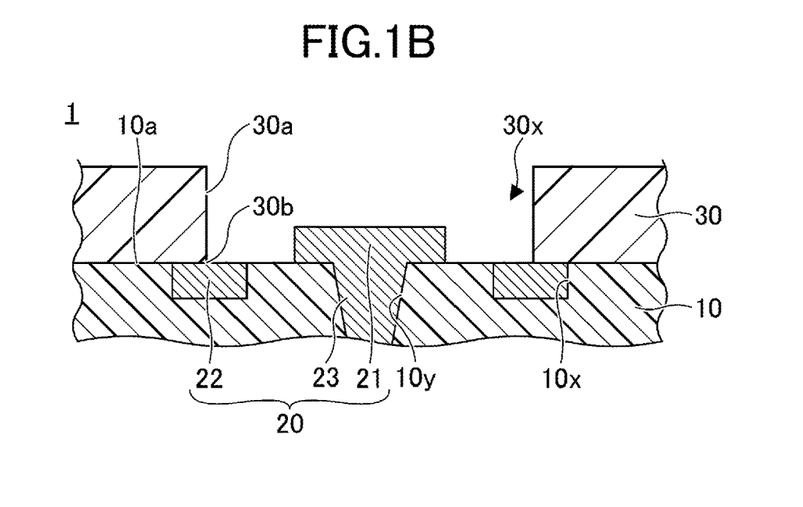

A structure of a wiring substrate according to an embodiment is described. FIGS. 1A and 1B are diagrams illustrating a wiring substrate according to an embodiment. FIG. 1A is a partial plan view and FIG. 1B is a partial sectional view taken along the line IB-IB of FIG. 1A.

Referring to FIGS. 1A and 1B, a wiring substrate 1 includes an insulating layer 10, a wiring layer 20, and a solder resist layer 30.

According to this embodiment, for convenience of description, the solder resist layer 30 side of the wiring substrate 1 is referred to as "upper side" or "first side," and the insulating layer 10 side of the wiring substrate 1 is referred to as "lower side" or "second side." Furthermore, with respect to each part or element of the wiring substrate 1, a surface on the solder resist layer 30 side is referred to as "upper surface" or "first surface," and a surface on the insulating layer 10 side is referred to as "lower surface" or "second surface." The wiring substrate 1, however, may be used in an inverted position or oriented at any angle. Furthermore, a plan view refers to a view of an object taken in a direction normal to an upper surface 10a of the insulating layer 10, and a planar shape refers to the shape of an object as viewed in a direction normal to the upper surface 10a of the insulating layer 10.

The insulating layer 10 is, for example, an insulating layer that may be formed using a build-up process as an interlayer insulating layer in multilayer wiring. Accordingly, another wiring layer and another insulating layer may be stacked under the insulating layer 10. In this case, via holes may be suitably provided in the insulating layer 10 and the other insulating layer, and the wiring layers may be connected via the via holes.

Examples of materials for the insulating layer 10 include insulating resins whose principal component is an epoxy resin or a polyimide resin, which is a non-photosensitive (thermosetting) resin. Furthermore, the insulating layer 10 may contain a filler such as silica ($SiO_2$). The thickness of the insulating layer 10 may be, for example, approximately 10 μm to approximately 50 μm. The coefficient of thermal expansion of the insulating layer 10 is, for example, approximately 15 ppm/° C. to approximately 20 ppm/° C.

The wiring layer 20 is formed in contact with the insulating layer 10. The wiring layer 20 includes at least a pad 21, a reinforcement wiring pattern 22, and a via interconnect 23. The wiring layer 20 may include a wiring pattern, etc., separately from the pad 21 and the reinforcement wiring pattern 22.

The pad 21 is formed on the upper surface 10a of the insulating layer 10, and is used to electrically connect the wiring substrate 1 to a semiconductor chip, another wiring substrate or the like. The lower surface of the pad 21 is in contact with the upper surface 10a of the insulating layer 10 and the via interconnect 23, and the upper surface and the side surface of the pad 21 are exposed on the insulating layer 10. That is, the pad 21 protrudes upward from the upper surface 10a of the insulating layer 10.

The planar shape of the pad 21 may be, but is not limited to, for example, a circle, and may also be an ellipse or a rectangle. Here, the term "rectangle" refers to not only a rectangle in a technical sense but also a rounded rectangle. The thickness of the pad 21 is, for example, approximately 8 μm to approximately 25 μm. Examples of materials for the pad 21 include copper (Cu).

The reinforcement wiring pattern 22 is a ring-shaped wiring pattern surrounding the pad 21 with a gap between the reinforcement wiring pattern 22 and the pad 21, namely, without contacting the pad 21, in a plan view. According to this embodiment, the pad 21 is circular and the reinforcement wiring pattern 22 is annular in a plan view. That is, the inner edge and the outer edge of the reinforcement wiring pattern 22 are circles different in diameter. In a plan view, the distance between the outer edge of the pad 21 and the inner edge of the reinforcement wiring pattern 22 is substantially constant, and is, for example, approximately 10 μm to approximately 50 μm. The reinforcement wiring pattern 22 is formed to match the shape of the pad 21. Therefore, for example, when the planar shape of the pad 21 is a rectangle, the inner edge and the outer edge of the reinforcement wiring pattern 22 as well are rectangles. Thus, the reinforcement wiring pattern 22 has a shape with an opening in the middle, so that the pad 21 is placed within the hole in a plan view.

The reinforcement wiring pattern 22 is formed in an annular groove 10x that is open at the upper surface 10a of the insulating layer 10. The upper surface of the reinforcement wiring pattern 22 is, for example, level with the upper surface 10a of the insulating layer 10. The reinforcement wiring pattern 22, however, may also protrude from the upper surface 10a of the insulating layer 10 or be depressed relative to the upper surface 10a of the insulating layer 10. That is, the upper surface of the reinforcement wiring pattern 22 may be at a position higher or lower than the upper surface 10a of the insulating layer 10.

The thickness of the reinforcement wiring pattern 22 is equal to the thickness of the pad 21, for example. Accordingly, with reference to the upper surface 10a of the insulating layer 10, the height of the reinforcement wiring pattern 22 is smaller than the height of the pad 21. That is, the upper surface of the reinforcement wiring pattern 22 is at a position lower than the upper surface of the pad 21. Here, the term "equal" allows for errors at the same level as variations in manufacturing.

A width W1 of the reinforcement wiring pattern 22 may be, for example, approximately 15 μm to approximately 60 μm. The thickness of the reinforcement wiring pattern 22 may be, for example, approximately 8 μm to approximately 25 μm. Examples of materials for the reinforcement wiring pattern 22 include copper (Cu). The reinforcement wiring pattern 22 may be a dummy pattern that has no electrical connection.

The via interconnect 23 fills in a via hole 10y that pierces through the insulating layer 10 to expose an upper surface of a lower wiring layer (not depicted). The via interconnect 23 may be, for example, formed with the pad 21 as a one-piece structure. The via hole 10y is, for example, a recess having the shape of an inverted truncated cone, having an upper-side opening at the upper surface 10a of the insulating layer 10 and a lower-side opening on the upper surface of the lower wiring layer (not depicted). The upper-side opening is greater in diameter than the lower-side opening.

The solder resist layer 30 is an insulating layer provided on the upper surface 10a of the insulating layer 10. The solder resist layer 30 includes an opening 30x, in which the pad 21 is completely exposed. The pad 21 is placed within the opening 30x without contacting the solder resist layer 30. That is, the wiring substrate 1 employs NSMD structure as pad formation structure. The wiring substrate 1, however, may also employ NSMD structure and SMD structure in mixture.

The solder resist layer 30 has an inner side surface 30a that surrounds (defines) the opening 30x. The inner side surface 30a is positioned on the reinforcement wiring pattern 22. Specifically, a lower end 30b of the inner side surface 30a, namely, an end of the inner side surface 30a on the insulating layer 10 side (an end of the inner side surface 30a toward the insulating layer 10), is in contact with the upper surface of the reinforcement wiring pattern 22. That is, the annular reinforcement wiring pattern 22 is covered with the solder resist layer 30 on the outer edge or circumference side and is exposed in the opening 30x of the solder resist layer 30 on the inner edge or circumference side.

Examples of materials for the solder resist layer 30 include photosensitive epoxy resins and acrylic resins. The thickness of the solder resist layer 30 may be, for example, approximately 5 μm to approximately 40 μm. Preferably, the solder resist layer 30 contains no filler or has a limited filler content because the opening 30x is famed by exposure to light and development. The filler content of the solder resist layer 30 is, for example, less than the filler content of the insulating layer 10. The coefficient of thermal expansion of the solder resist layer 30 is, for example, higher than the coefficient of thermal expansion of the insulating layer 10. The coefficient of thermal expansion of the solder resist layer 30 is, for example, approximately 25 ppm/° C. to approximately 30 ppm/° C.

A surface treatment layer may be provided on the upper surfaces of the pad 21 and the reinforcement wiring pattern 22 exposed in the opening 30x. Examples of surface treatment layers include metal layers such as a gold (Au) layer, a Ni/Au layer (a laminated metal layer of a nickel [Ni] layer and a Au layer stacked in this order), and a Ni/Pd/Au layer (a laminated metal layer of a Ni layer, a palladium [Pd] layer, and a Au layer stacked in this order). Furthermore, anti-oxidation treatment such as an organic solderability preservative (OSP) process may be performed on the upper surfaces of the pad 21 and the reinforcement wiring pattern 22 exposed in the opening 30x. As the result of the OSP process, an organic coating composed of an azole compound, an imidazole compound or the like is formed as a surface treatment layer.

Next, a method of manufacturing a wiring substrate according to this embodiment is described. FIGS. 2A through 2F are diagrams illustrating a process of manufacturing a wiring substrate according to this embodiment. While a process of forming a single wiring substrate is illustrated according to this embodiment, the process may be adapted to manufacture a structure to become multiple wiring substrates and thereafter divide the structure into individual wiring substrates.

Figure 2A:
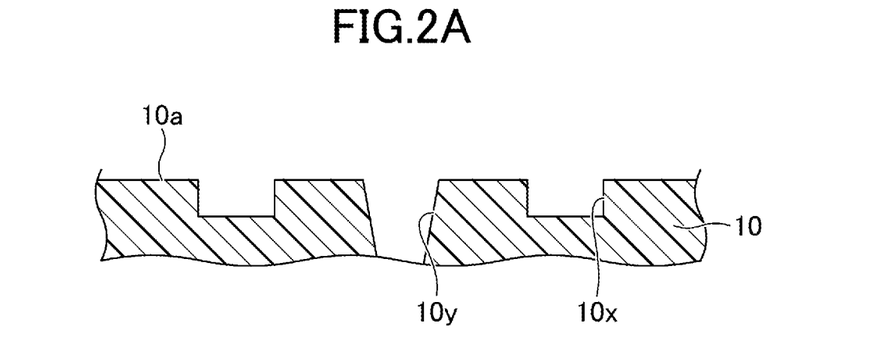
FIGS. 2A through 2F are diagrams illustrating a process of manufacturing a wiring substrate according to the embodiment.

First, in the process illustrated in FIG. 2A, the insulating layer 10 is prepared, and the annular groove 10x that is open at the upper surface 10a and the via hole 10y are formed in the insulating layer 10. The groove 10x and the via hole 10y may be formed by, for example, laser processing. The groove 10x is annularly formed to have circular inner and outer edges that differ in diameter in a plan view. The width of the groove 10x may be, for example, approximately 15 μm to approximately 60 μm. The depth of the groove 10x may be, for example, approximately 8 μm to approximately 25 μm. When the groove 10x and the via hole 10y are formed by laser processing, it is preferable to perform a desmear process to remove residual resin adhering to a surface defining the bottom and the side of the groove 10x (hereinafter "groove surface") of the insulating layer 10, a surface defining the side of the via hole 10y (hereinafter "via hole surface") of the insulating layer 10, etc. By performing the desmear process, it is also possible to roughen the upper surface 10a, the groove surface, and the via hole surface of the insulating layer 10, etc., as well as to remove the residual resin.

Figure 2B:
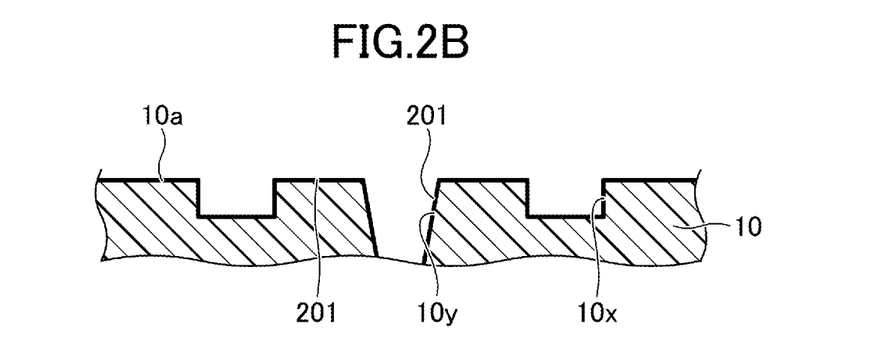

Next, in the process illustrated in FIGS. 2B through 2E, the wiring layer 20 including the pad 21, the reinforcement wiring pattern 22, and the via interconnect 23 are formed in contact with the upper surface 10a of the insulating layer 10. Specifically, first, as illustrated in FIG. 2B, a seed layer 201 composed of copper (Cu) or the like is formed by electroless plating or sputtering. The seed layer 201 is formed to continuously cover the groove surface, the upper surface 10a, and the via hole surface of the insulating layer 10, etc.

Figure 2C:
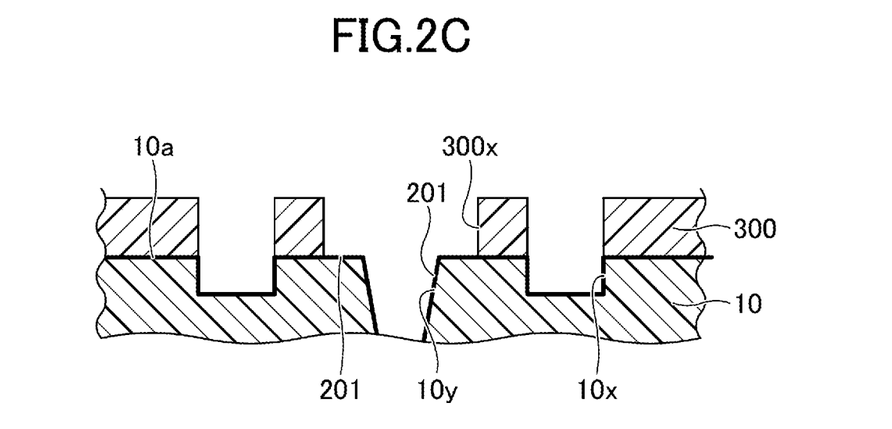

Next, as illustrated in FIG. 2C, a resist layer 300 including an opening 300x corresponding to the wiring layer 20 is famed on the seed layer 201. The resist layer 300 may be formed by, for example, laminating the upper surface of the seed layer 201 with a photosensitive dry film resist. The opening 300x may be famed by, for example, exposing to light and developing the dry film resist.

Figure 2D:
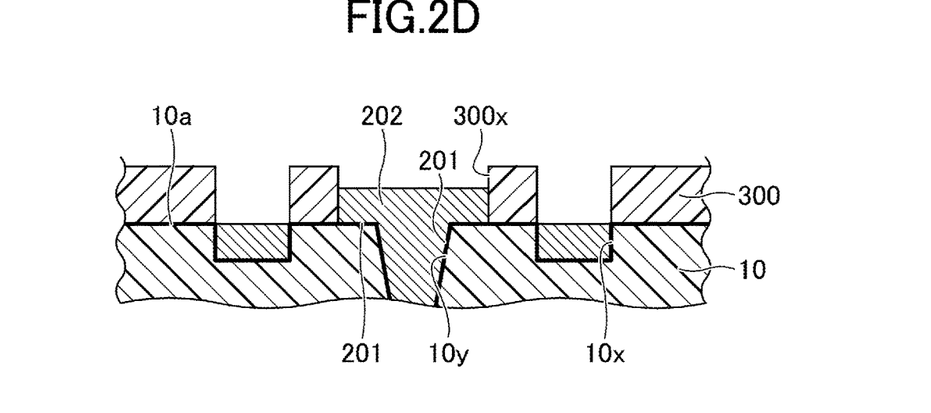

Next, as illustrated in FIG. 2D, an electroplating layer 202 is formed by depositing copper (Cu) on the surface of the seed layer 201 exposed in the opening 300x of the resist layer 300 by, for example, electroplating using the seed layer 201 as a power feed layer. As a result, the electroplating layer 202 is formed on the seed layer 201.

Figure 2E:
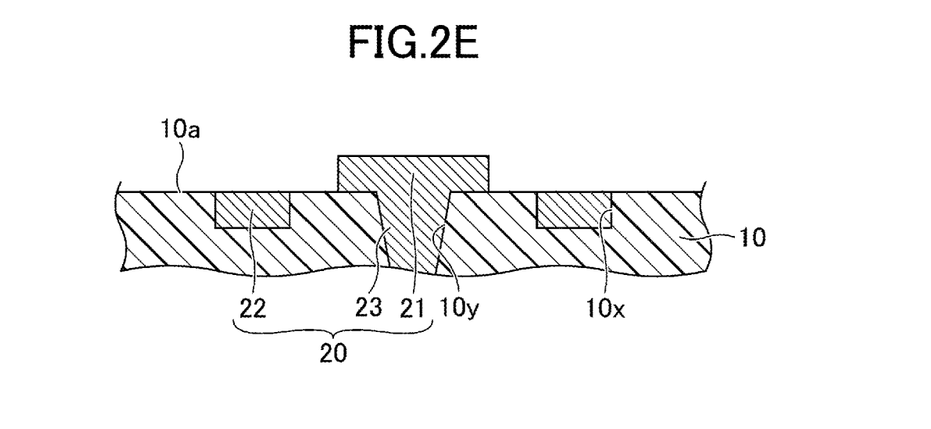

Next, as illustrated in FIG. 2E, after removing the resist layer 300, part of the seed layer 201 not covered with the electroplating layer 202 is removed by etching, using the electroplating layer 202 as a mask. As a result, the wiring layer 20 in which the electroplating layer 202 is stacked on the seed layer 201 is formed. The wiring layer 20 includes the pad 21 formed on the upper surface 10a of the insulating layer 10, the reinforcement wiring pattern 22 formed in the groove 10x, and the via interconnect 23 formed in the via hole 10y. The reinforcement wiring pattern 22 is formed to surround the pad 21 with a gap between the reinforcement wiring pattern 22 and the pad 21 in a plan view. In FIG. 2E, the seed layer 201 and the electroplating layer 202 are depicted not separately but together as a one-piece structure as the wiring layer 20 (the same is the case with FIGS. 1B, 4B, 5A through 5C and 6).

Figure 2F:
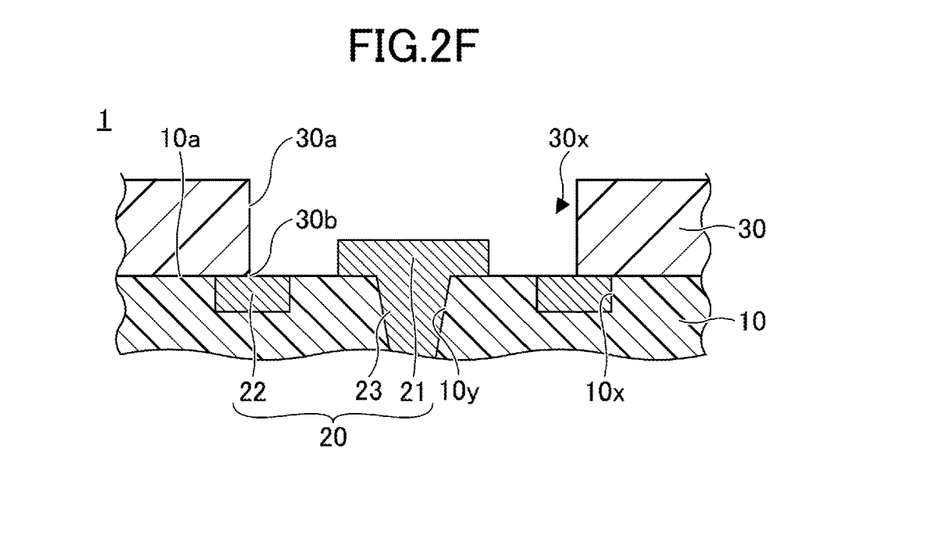

Next, in the process illustrated in FIG. 2F, the solder resist layer 30 covering the wiring layer 20 including the pad 21, the reinforcement wiring pattern 22, and the via interconnect 23 is formed on the upper surface 10a of the insulating layer 10, and the opening 30x is thereafter formed in the solder resist layer 30. The solder resist layer 30 may be formed by, for example, applying an insulating resin in liquid or paste form on the upper surface 10a of the insulating layer 10 by screen printing, roll coating, spin coating or the like such that the applied insulating resin covers the wiring layer 20. Alternatively, the upper surface 10a of the insulating layer 10 may be laminated with a film-shaped insulating resin such that the insulating resin covers the wiring layer 20. Examples of insulating resins include photosensitive epoxy resins and acrylic resins.

The applied insulating resin or the laminate of insulating resin is exposed to light and developed to form the opening 30x in the solder resist layer 30. The opening 30x is formed such that the lower end 30b of the inner side surface 30a of the solder resist layer 30 circularly contacts the upper surface of the reinforcement wiring pattern 22. As a result, the annular reinforcement wiring pattern 22 is covered with the solder resist layer 30 on the outer circumference side and is exposed in the opening 30x of the solder resist layer 30 on the inner circumference side. Furthermore, the pad 21 is completely exposed in the opening 30x. That is, the pad 21 is positioned in the opening 30x without contacting the solder resist layer 30. The above-described surface treatment layer may be provided on the upper surfaces of the pad 21 and the reinforcement wiring pattern 22 exposed in the opening 30x on an as-needed basis. By the above-described process, the wiring substrate 1 is completed.

Figure 3A:
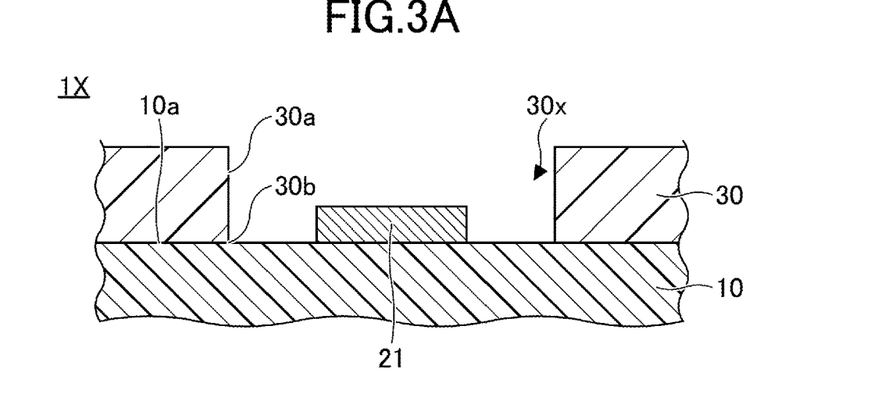
FIGS. 3A through 3C are sectional views of a wiring substrate according to a comparative example.
Figure 3B:
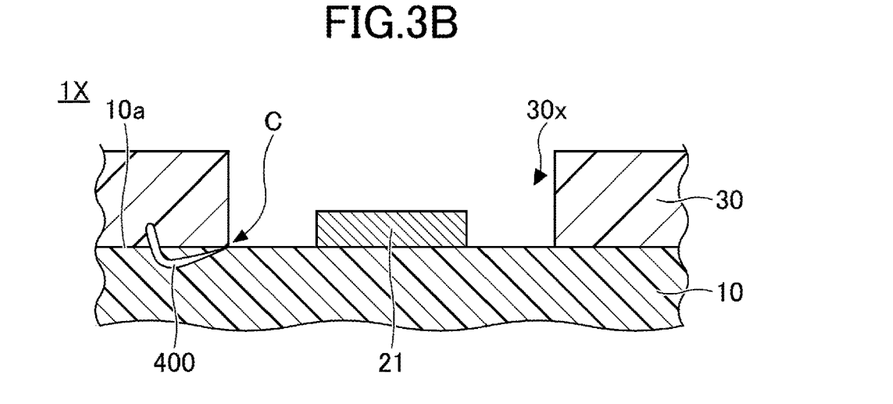
Figure 3C:
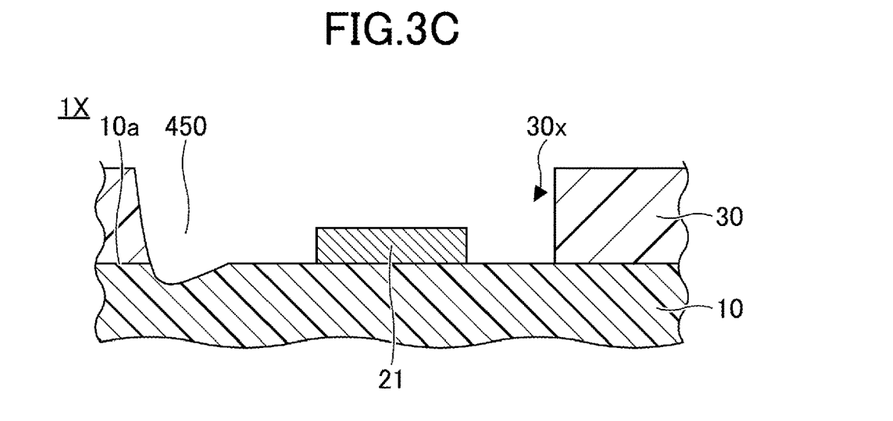

Here, effects achieved by the wiring substrate 1 are described while illustrating a comparative example. FIGS. 3A through 3C are sectional views of a wiring substrate according to the comparative example. A wiring substrate 1X illustrated in FIG. 3A is different from the wiring substrate 1 (see FIGS. 1A and 1B, etc.) in that the groove 10x is not formed in the insulating layer 10 and that the reinforcement wiring pattern 22 is not included. In FIGS. 3A through 3C, a graphical representation of the via interconnect 23 of the wiring layer 20 is omitted.

According to the wiring substrate 1X, in the solder resist layer 30, the lower end 30b of the inner side surface 30a at the opening 30x is in contact with the upper surface 10a of the insulating layer 10. As described above, the coefficient of thermal expansion of the solder resist layer 30 is higher than the coefficient of thermal expansion of the insulating layer 10. That is, the insulating layer 10 is less flexible and more likely to break than the solder resist layer 30.

Therefore, when high temperature treatment such as reflow soldering is performed, a stress occurs at the interface between the insulating layer 10 and the solder resist layer 30 because of the difference (mismatch) between their coefficients of thermal expansion. When the adhesive force between the insulating layer 10 and the solder resist layer 30 is high, as illustrated in FIG. 3B, a crack 400 starting from the stating point of the interface (indicated by arrow C) where the stress is maximized occurs in the insulating layer 10, which is less flexible and more likely to break than the solder resist layer 30.

The crack 400 that has occurred in the insulating layer 10 spreads to the solder resist layer 30 to cause a chip 450 in the solder resist layer 30 as illustrated in FIG. 3C. Once the chip 450 is caused, the insulation between adjacent pads 21 and the connection between the wiring substrate 1X and a semiconductor chip or another substrate connected to the wiring substrate 1X become less reliable.

In contrast, according to the wiring substrate 1, in the solder resist layer 30, the lower end 30b of the inner side surface 30a at the opening 30x is in circular contact with the upper surface of the reinforcement wiring pattern 22. That is, according to the wiring substrate 1, there is no interface between the insulating layer 10 and the solder resist layer 30 at the opening 30x. Therefore, no part serves as the starting point of a crack corresponding to arrow C of FIG. 3B. According to the wiring substrate 1, it is the reinforcement wiring pattern 22 composed of metal, which has high stiffness, that is in contact with the solder resist layer 30 at the opening 30x. Therefore, even when high temperature treatment such as reflow soldering is performed, no breakage occurs in the reinforcement wiring pattern 22. Therefore, it is possible to prevent a crack or chip to be caused in the insulating layer 10 or the solder resist layer 30. As a result, it is possible to ensure the reliability of the insulation between adjacent pads 21 and the reliability of the connection between the wiring substrate 1 and a semiconductor chip or another substrate connected to the wiring substrate 1.

According to the pad structure of the comparative example, the occurrence of cracking or chipping is conspicuous when the difference between the coefficient of thermal expansion of the solder resist layer 30 and the coefficient of thermal expansion of the insulating layer 10 is 10 ppm/° C. or more. Therefore, the pad structure of the wiring substrate 1 is particularly effective when the difference between the coefficient of thermal expansion of the solder resist layer 30 and the coefficient of thermal expansion of the insulating layer 10 is 10 ppm/° C. or more.

[Variations]

Figure 4A:
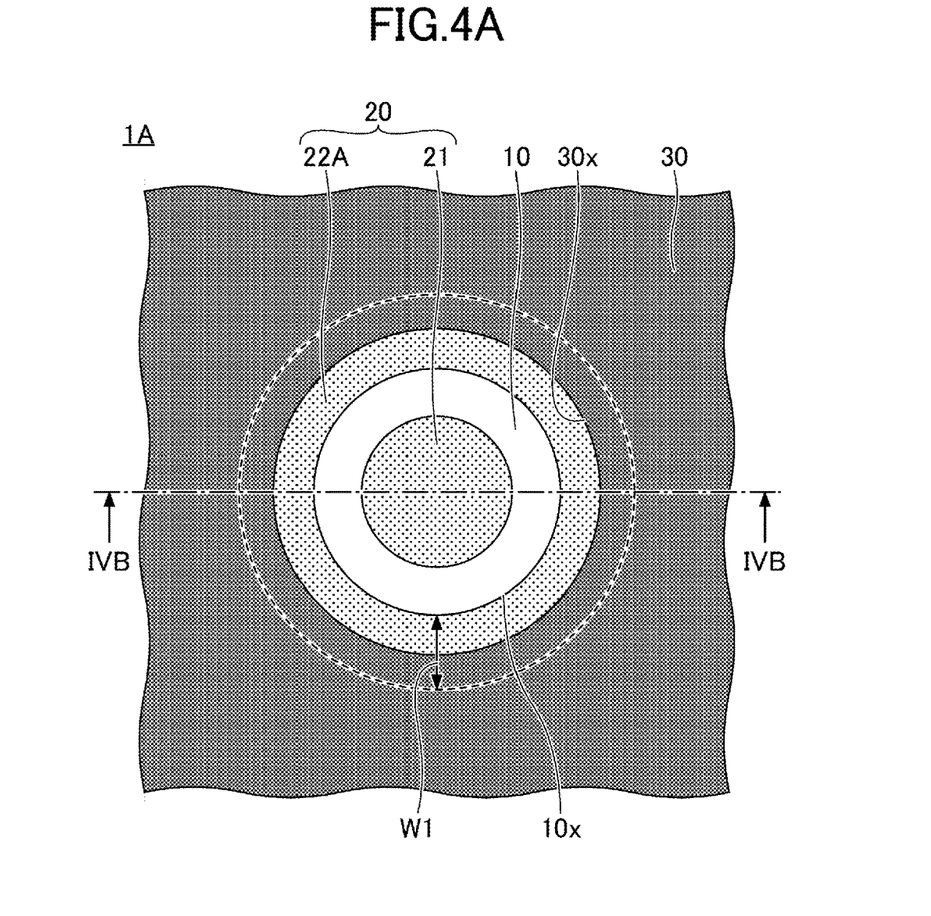
FIGS. 4A and 4B are diagrams illustrating a wiring substrate according to a first variation of the embodiment.
Figure 4B:
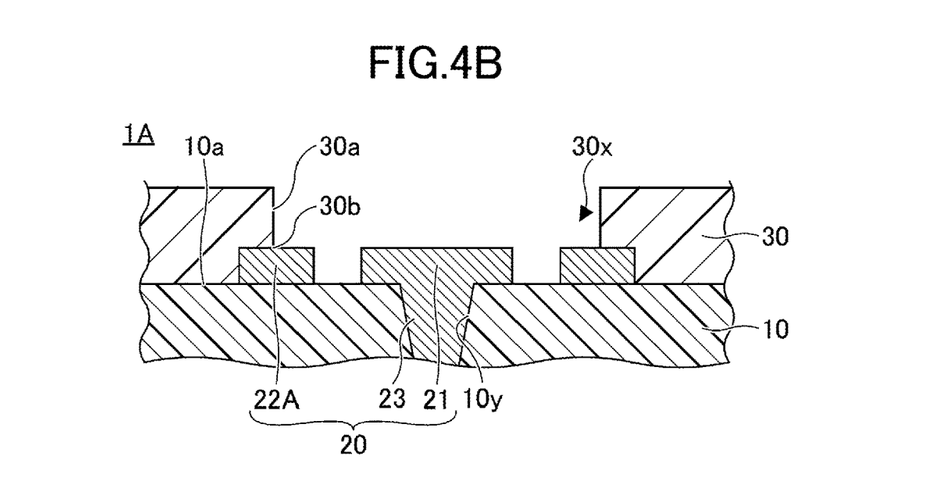

As a first variation of the embodiment, a wiring substrate having a reinforcement wiring pattern of a different structure is illustrated. In the following description of the first variation, a description of the same elements as those of the above-described embodiment may be omitted.

FIGS. 4A and 4B are diagrams illustrating a wiring substrate according to the first variation. FIG. 4A is a partial plan view and FIG. 4B is a partial sectional view taken along the line IVB-IVB of FIG. 4A.

Referring to FIGS. 4A and 4B, a wiring substrate 1A is different from the wiring substrate 1 (see FIGS. 1A and 1B, etc.) in that the reinforcement wiring pattern 22 is replaced with a reinforcement wiring pattern 22A. The reinforcement wiring pattern 22A is formed on the upper surface 10a of the insulating layer 10. That is, the groove 10x is not provided in the insulating layer 10, and the reinforcement wiring pattern 22A protrudes from the upper surface 10a of the insulating layer 10. With reference to the upper surface 10a of the insulating layer 10, the reinforcement wiring pattern 22A has the same height as the pad 21, for example. The reinforcement wiring pattern 22A may be equal in planar shape, width, and material to the reinforcement wiring pattern 22.

In the solder resist layer 30, the lower end 30b of the inner side surface 30a at the opening 30x is in contact with the upper surface of the reinforcement wiring pattern 22A. That is, the upper surface of the annular reinforcement wiring pattern 22A is covered with the solder resist layer 30 on the outer circumference side and is exposed in the opening 30x of the solder resist layer 30 on the inner circumference side. Furthermore, the outer (circumferential) side surface of the reinforcement wiring pattern 22A is covered with the solder resist layer 30, and the inner (circumferential) side surface of the reinforcement wiring pattern 22A is exposed in the opening 30x of the solder resist layer 30.

The wiring substrate 1A may be manufactured in the same manner as the wiring substrate 1 except that the groove 10x is not provided in the insulating layer 10 in the process of FIG. 2A.

Thus, the reinforcement wiring pattern 22A may be famed on the upper surface 10a of the insulating layer 10 without providing the groove 10x in the insulating layer 10. Either the structure of the wiring substrate 1 or the structure of the wiring substrate 1A may be suitably used as needed.

Figure 5A:
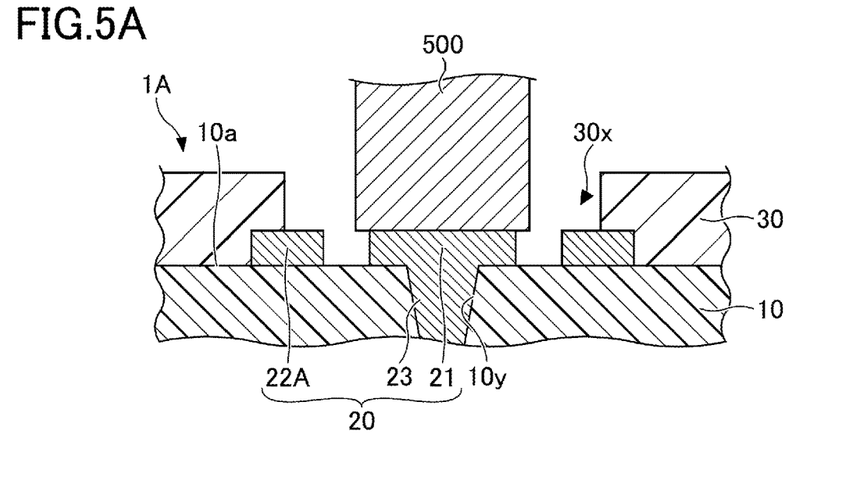
FIGS. 5A through 5C are diagrams illustrating the connection of a pad and a pin.
Figure 5B:
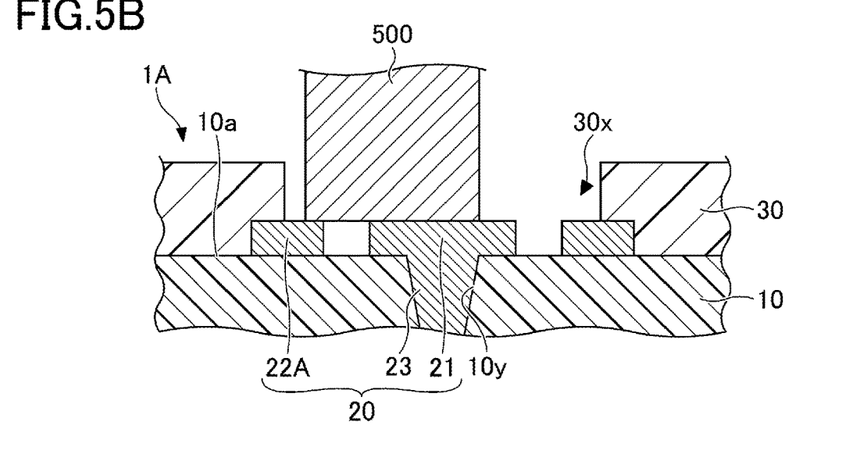
Figure 5C:
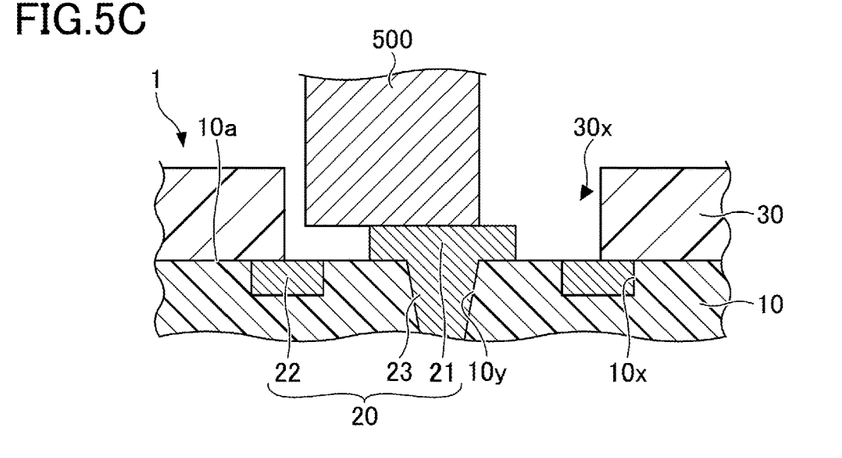

To connect the pad 21 and another substrate or the like, solder may be used in some cases and a pin 500 of a CPU socket as illustrated in FIGS. 5A through 5C may be used in other cases. In the case of using the pin 500 with the wiring substrate 1A, in some cases, the pin 500 may contact only the pad 21 as illustrated in FIG. 5A. In other cases, however, the pin 500 may be misaligned and contact the pad 21 and the reinforcement wiring pattern 22A as illustrated in FIG. 5B. In the case of FIG. 5B, the reinforcement wiring pattern 22A is at the same potential as the pad 21. This is equivalent to a substantial decrease in the interval between adjacent pads 21 and may reduce the reliability of the insulation between the pads 21.

In the case of using the pin 500 with the wiring substrate 1 as illustrated in FIG. 5C, the pin 500 does not contact the reinforcement wiring pattern 22 even if the pin 500 is misaligned. Therefore, the reinforcement wiring pattern 22 is prevented from being at the same potential as the pad 21. Therefore, there is no substantial decrease in the interval between adjacent pads 21, and it is possible to ensure the reliability of the insulation between the pads 21. Accordingly, in the case of using a pin for a connection to the pad 21, it is preferable to select the structure of the wiring substrate 1, where the reinforcement wiring pattern 22 is at a position lower than the pad 21.

Figure 8A:
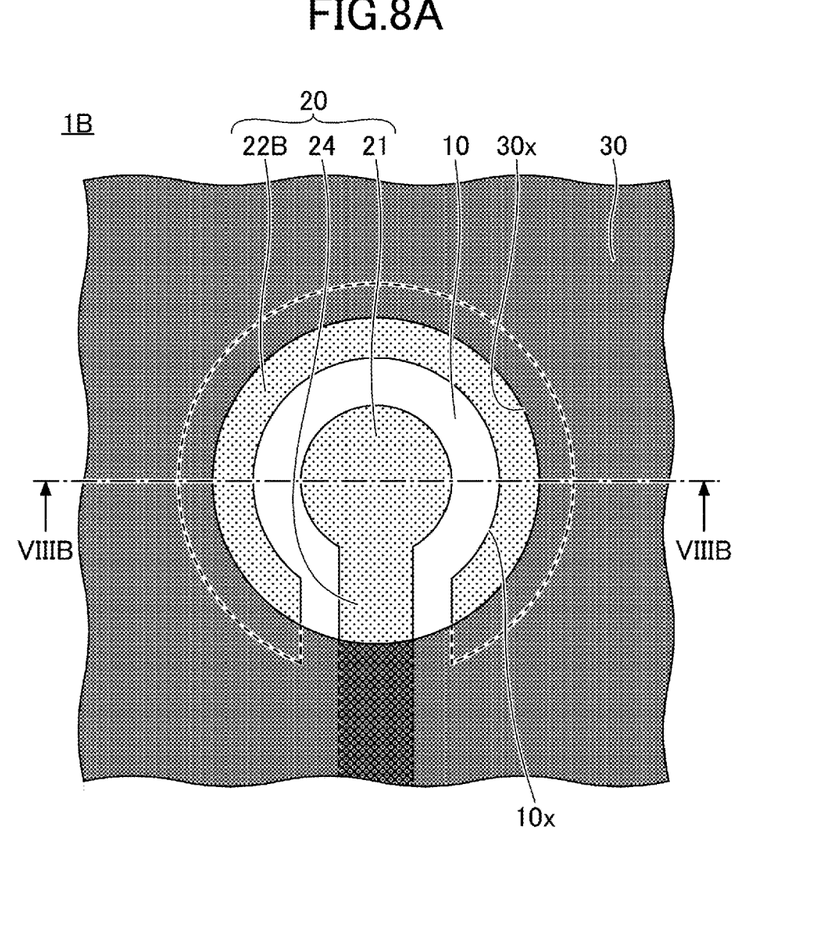
FIGS. 8A and 8B are diagrams illustrating a wiring substrate according to a second variation of the embodiment.
Figure 8B:
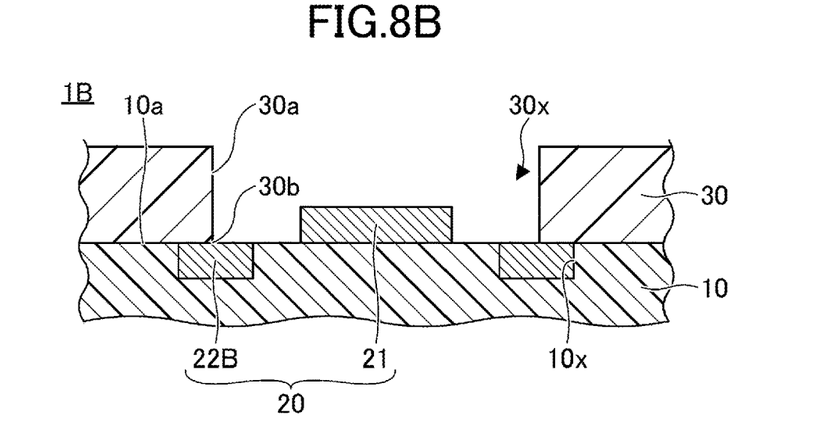

As a second variation of the embodiment, a wiring substrate having a wiring layer of a different shape is illustrated. In the following description of the second variation, a description of the same elements as those of the above-described embodiment may be omitted.

FIGS. 8A and 8B are diagrams illustrating a wiring substrate according to the second variation. FIG. 8A is a partial plan view and FIG. 8B is a partial sectional view taken along the line VIIIB-VIIIB of FIG. 8A.

Referring to FIGS. 8A and 8B, a wiring substrate 1B is different from the wiring substrate 1 (see FIGS. 1A and 1B, etc.) in that the reinforcement wiring pattern 22 is replaced with a reinforcement wiring pattern 22B and that the wiring layer 20 includes a wiring pattern 24 in place of the via interconnect 23. In a plan view, the reinforcement wiring pattern 22B includes a cut to form an incomplete loop compared with the wiring pattern 22, and the wiring pattern 24 extends from the pad 21 through the cut of the reinforcement wiring pattern 22B. The wiring substrate 1B may be manufactured in the same manner as the wiring substrate 1 except that the groove 10x provided in the insulating layer 10 has a shape corresponding to the shape of the reinforcement wiring pattern 22B in the process of FIG. 2A and that the via hole 10y is not formed in the insulating layer 10 in the process of FIG. 2A. Accordingly, in the process of FIG. 2B, the seed layer 201 is formed to continuously cover the groove surface and the upper surface 10a of the insulating layer 10, and in the process of FIGS. 2C through 2E, the wiring layer 20 including the pad 21, the reinforcement wiring pattern 22B, and the wiring pattern 24 are formed in contact with the upper surface 10a of the insulating layer 10.

[Application]

Figure 6:
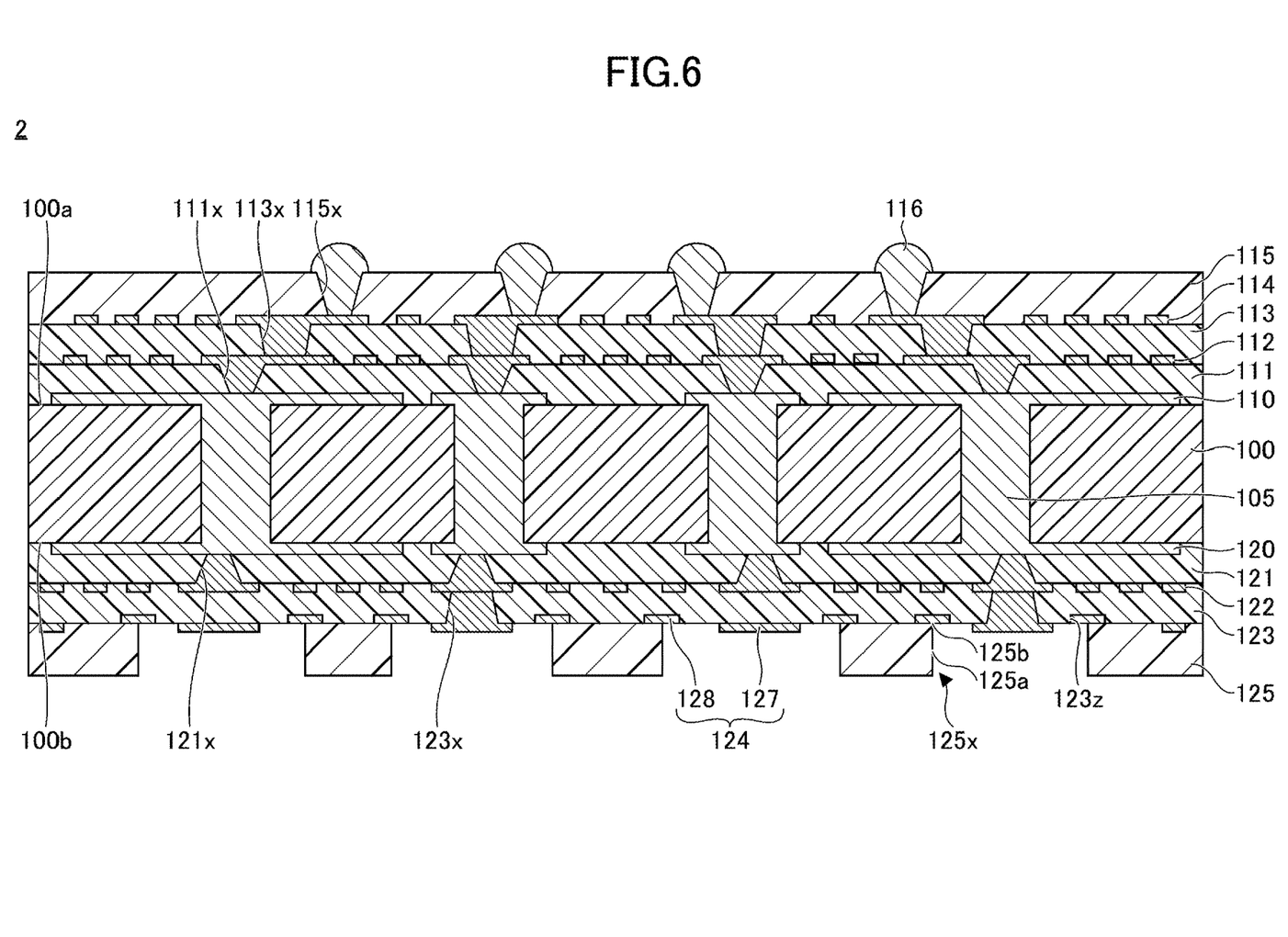
FIG. 6 is a sectional view of a multilayer wiring substrate according to an application.
Figure 7:
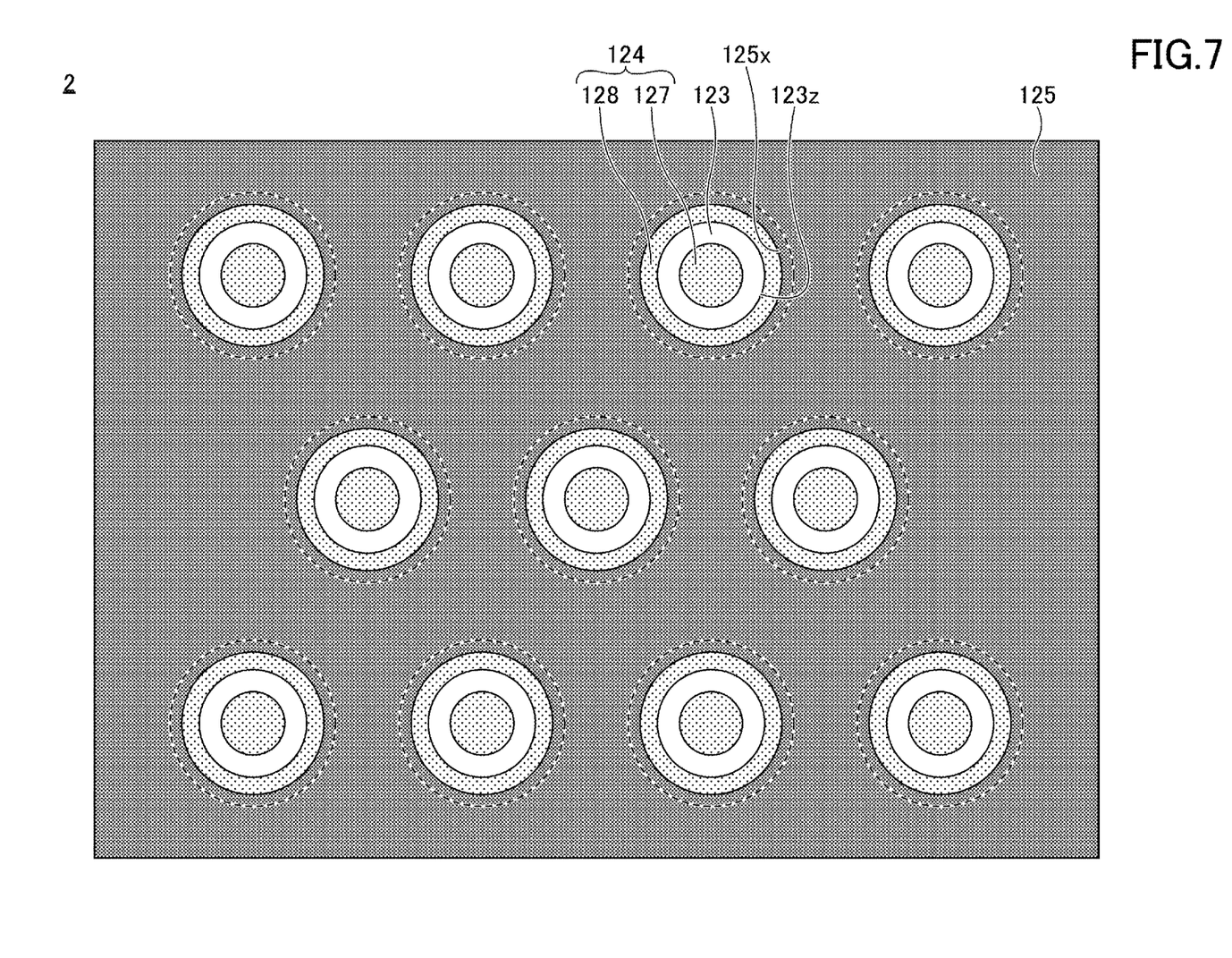
FIG. 7 is a bottom plan view of the multilayer wiring substrate according to the application.

As an application, a multiplayer wiring substrate including the pad structure of the wiring substrate 1 is illustrated. In the following description of the application, a description of the same components as those of the above-described embodiment may be omitted.

FIGS. 6 and 7 are a sectional view and a bottom plan view, respectively, of a multilayer wiring substrate according to this application.

Referring to FIGS. 6 and 7, a multilayer wiring substrate 2 includes a core layer 100, and further includes a wiring layer 110, an insulating layer 111, a wiring layer 112, an insulating layer 113, a wiring layer 114, and a solder resist layer 115 that are successively stacked on a first surface 100*a* of the core layer 100. Furthermore, the multilayer wiring substrate 2 includes a wiring layer 120, an insulating layer 121, a wiring layer 122, an insulating layer 123, a wiring layer 124, and a solder resist layer 125 that are successively stacked on a second surface 100*b* of the core layer 100.

According to this application, for convenience of description, the solder resist layer 115 side of the multilayer wiring substrate 2 is referred to as "upper side" or "first side," and the solder resist layer 125 side of the multilayer wiring substrate 2 is referred to as "lower side" or "second side." Furthermore, with respect to each part or element of the multilayer wiring substrate 2, a surface on the solder resist layer 115 side is referred to as "upper surface" or "first surface," and a surface on the solder resist layer 125 side is referred to as "lower surface" or "second surface." The multilayer wiring substrate 2, however, may be used in an inverted position or oriented at any angle.

Examples of the core layer 100 include a so-called glass epoxy substrate having glass cloth impregnated with an insulating resin such as an epoxy resin or a polyimide resin and a substrate having a woven or non-woven fabric of glass fibers, carbon fibers, or aramid fibers impregnated with an epoxy resin or the like.

The wiring layer 110 is formed on the first surface 100*a* of the core layer 100. The wiring layer 110 is electrically connected to the wiring layer 120 via through vias 105 piercing through the core layer 100. Examples of materials for the wiring layer 110 include copper (Cu). The insulating layer 111 is formed on the first surface 100*a* of the core layer 100 in such a manner as to cover the wiring layer 110. Examples of materials for the insulating layer 111 include an insulating resin whose principal component is an epoxy resin or a polyimide resin. The thickness of the insulating layer 111 may be, for example, approximately 10 μm to approximately 50 μm. The insulating layer 111 may contain a filler such as silica ($SiO_2$).

The wiring layer 112 is formed on the first side of the insulating layer 111. The wiring layer 112 includes via interconnects filling in via holes 111*x* piercing through the insulating layer 111 to expose the upper surface of the wiring layer 110, and includes a wiring pattern formed on the upper surface of the insulating layer 111. The wiring pattern of the wiring layer 112 is electrically connected to the wiring layer 110 via the via interconnects. The via holes 111*x* are, for example, recesses having the shape of an inverted truncated cone, having an upper-side opening at the upper surface of the insulating layer 111 and a lower-side opening on the upper surface of the wiring layer 110. The upper-side opening is greater in diameter than the lower-side opening. Examples of materials for the wiring layer 112 include copper (Cu).

The insulating layer 113 is famed on the upper surface of the insulating layer 111 in such a manner as to cover the wiring layer 112. The material and the thickness of the insulating layer 113 are equal to the material and the thickness, respectively, of the insulating layer 111, for example. The insulating layer 113 may contain a filler such as silica ($SiO_2$).

The wiring layer 114 is formed on the first side of the insulating layer 113. The wiring layer 114 includes via interconnects filling in via holes 113*x* piercing through the insulating layer 113 to expose the upper surface of the wiring layer 112, and includes a wiring pattern formed on the upper surface of the insulating layer 113. The wiring pattern of the wiring layer 114 is electrically connected to the wiring layer 112 via the via interconnects. The via holes 113*x* are, for example, recesses having the shape of an inverted truncated cone, having an upper-side opening at the upper surface of the insulating layer 113 and a lower-side opening on the upper surface of the wiring layer 112. The upper-side opening is greater in diameter than the lower-side opening. Examples of materials for the wiring layer 114 include copper (Cu).

The solder resist layer 115 is the outermost layer of the multilayer wiring substrate 2 on its first side, and is an insulating layer formed on the upper surface of the insulating layer 113 in such a manner as to cover the wiring layer 114. The solder resist layer 115 may be formed of, for example, a photosensitive resin such as a photosensitive epoxy or acrylic resin. The thickness of the solder resist layer 115 may be, for example, approximately 5 μm to approximately 40 μm.

The solder resist layer 115 includes openings 115*x*, and the upper surface of the wiring layer 114 is partly exposed at the bottom of the openings 115*x*. The planar shape of the openings 115*x* is, for example, a circle. A metal layer may be formed or anti-oxidation treatment such as an OSP process may be performed on the upper surface of the wiring layer 114 exposed in the openings 115*x* on an as-needed basis.

External connection terminals 116 are formed on the upper surface of the wiring layer 114 exposed at the bottom of the openings 115*x*. The external connection terminals 116 are, for example, solder bumps. Examples of materials for solder bumps include alloys containing lead (Pb), tin-copper (Sn—Cu) alloys, tin-silver (Sn—Ag) alloys, and tin-silver-copper (Sn—Ag—Cu) alloys. The external connection terminals 116 serve as terminals for electrically connecting to a semiconductor chip.

The wiring layer 120 is formed on the second surface 100*b* of the core layer 100. Examples of materials for the wiring layer 120 include copper (Cu). The insulating layer 121 is formed on the second surface 100*b* of the core layer 100 in such a manner as to cover the wiring layer 120. The material and the thickness of the insulating layer 121 are equal to the material and the thickness, respectively, of the insulating layer 111, for example. The insulating layer 121 may contain a filler such as silica ($SiO_2$).

The wiring layer 122 is formed on the second side of the insulating layer 121. The wiring layer 122 includes via interconnects filling in via holes 121*x* piercing through the insulating layer 121 to expose the lower surface of the wiring layer 120, and includes a wiring pattern formed on the lower surface of the insulating layer 121. The wiring pattern of the wiring layer 122 is electrically connected to the wiring layer 120 via the via interconnects. The via holes 121*x* are, for example, recesses having the shape of a truncated cone, having an upper-side opening on the lower surface of the wiring layer 120 and a lower-side opening at the lower surface of the insulating layer 121. The lower-side opening is greater in diameter than the upper-side opening. Examples of materials for the wiring layer 122 include copper (Cu).

The insulating layer 123 is famed on the lower surface of the insulating layer 121 in such a manner as to cover the wiring layer 122. The material and the thickness of the insulating layer 123 are equal to the material and the thickness, respectively, of the insulating layer 111, for example. The insulating layer 123 may contain a filler such as silica ($SiO_2$).

The wiring layer 124 is formed in contact with the insulating layer 123. The wiring layer 124 includes at least pads 127 and reinforcement wiring patterns 128. The pads 127 are famed on the lower surface of the insulating layer 123, and the reinforcement wiring patterns 128 are famed in annular grooves 123z open at the lower surface of the insulating layer 123. The pads 127 and the reinforcement wiring patterns 128 are equal in structure to the pad 21 and the reinforcement wiring pattern 22, respectively, of the wiring substrate 1 (see FIGS. 1A and 1B). The wiring layer 124 may include a wiring pattern, etc., separately from the pads 127 and the reinforcement wiring patterns 128.

At least one or more of the pads 127 are electrically connected to the wiring layer 122 through via interconnects filling via holes 123x piercing through the insulating layer 123 to expose the lower surface of the wiring layer 122. The via holes 123x are, for example, recesses having the shape of a truncated cone, having an upper-side opening on the lower surface of the wiring layer 122 and a lower-side opening at the lower surface of the insulating layer 123. The lower-side opening is greater in diameter than the upper-side opening. Examples of materials for the wiring layer 124 include copper (Cu).

The solder resist layer 125 is the outermost layer of the multilayer wiring substrate 2 on its second side, and is an insulating layer provided on the lower surface of the insulating layer 123. The solder resist layer 125 includes openings 125x, in which the pads 127 are completely exposed. The pads 127 are positioned one in each of the openings 125x without contacting the solder resist layer 125. The solder resist layer 125 has an inner side surface 125a that surrounds (defines) each opening 125x. The inner side surface 125a is positioned on the corresponding reinforcement wiring pattern 128. Specifically, an upper end 125b of the inner side surface 125a, namely, an end of the inner side surface 125a on the insulating layer 123 side (an end of the inner side surface 125a toward the insulating layer 123), is in contact with the lower surface of the corresponding reinforcement wiring pattern 128. That is, each annular reinforcement wiring pattern 128 is covered with the solder resist layer 125 on the outer circumference side and is exposed in the corresponding opening 125x of the solder resist layer 125 on the inner circumference side.

The material and the thickness of the solder resist layer 125 are equal to the material and the thickness, respectively, of the solder resist layer 115, for example. The pads 127 exposed in the openings 125x may be used as pads for electrically connecting to a mounting board such as a motherboard. The above-described metal layer may be formed or anti-oxidation treatment such as an OSP process may be performed on the lower surfaces of the pads 127 exposed in the openings 125x on an as-needed basis.

Thus, the multilayer wiring substrate 2 includes the same pad structure as the wiring substrate 1. That is, the multilayer wiring substrate 2 includes the wiring layer 124 that includes the pads 127 and the reinforcement wiring patterns 128, and includes the solder resist layer 125 having the inner side surface 125a having the upper end 125b in contact with the lower surface of the reinforcement wiring pattern 128 at each of the openings 125x. This makes it possible to prevent cracking or chipping from occurring in the insulating layer 123 or the solder resist layer 125 the same as in the above-described embodiment. As a result, it is possible to ensure the reliability of the insulation between adjacent pads 127 and the reliability of the connection between the multilayer wiring substrate 2 and a mounting board such as a motherboard connected to the multilayer wiring substrate 2.

According to the illustrated example, the multilayer wiring substrate 2 has the same pad structure as that of the wiring substrate 1 provided on the side to connect to a mounting board such as a motherboard. The multilayer wiring substrate 2, however, is not limited to this configuration. That is, the multilayer wiring substrate 2 may have the same pad structure as that of the wiring substrate 1 provided on the semiconductor chip mounting side (on the side of the external connection terminals 116).

The same pad structure as that of the wiring substrate 1, whether provided on the side to connect to a mounting board such as a motherboard or the semiconductor chip mounting side, may be used in mixture with a SMD-type pad structure. Furthermore, the same pad structure as that of the wiring substrate 1A may be used in place of the same pad structure as that of the wiring substrate 1.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

Various aspects of the subject-matter described herein may be set out non-exhaustively in the following numbered clauses:

1. A method of manufacturing a wiring substrate, including:
   forming a pad on and a reinforcement wiring pattern in or on a surface of a first insulating layer such that the reinforcement wiring pattern surrounds the pad without contacting the pad in a plan view;
   forming a second insulating layer on the surface of the first insulating layer such that the second insulating layer covers the pad and the reinforcement wiring pattern; and
   forming an opening in the second insulating layer such that the pad is exposed in the opening without contacting the second insulating layer and that an inner side surface of the second insulating layer that defines the opening is positioned on the reinforcement wiring pattern.

2. The method of clause 1, wherein an end of the inner side surface toward the first insulating layer is in contact with the reinforcement wiring pattern.

3. The method of clause 1, further including:
   forming a groove in the surface of the first insulating layer,
   wherein the reinforcement wiring pattern is famed in the groove in the forming of the pad and the reinforcement wiring pattern.

What is claimed is:

1. A wiring substrate comprising:
   a first insulating layer;
   a pad on a surface of the first insulating layer;
   a reinforcement wiring pattern surrounding the pad without contacting the pad in a plan view, the reinforcement wiring pattern being in or on the surface of the first insulating layer; and a second insulating layer on the surface of the first insulating layer, the second insulating layer including an opening in which the pad is exposed without contacting the second insulating layer, the second insulating layer including an inner side surface defining the opening, the inner side surface being positioned on the reinforcement wiring pattern, wherein the reinforcement wiring pattern has a shape with an opening in a middle in the plan view.

2. The wiring substrate as claimed in claim 1, wherein an end of the inner side surface toward the first insulating layer is in contact with the reinforcement wiring pattern.

3. The wiring substrate as claimed in claim 1, wherein the reinforcement wiring pattern is in a groove formed in the surface of the first insulating layer.

4. The wiring substrate as claimed in claim 1, wherein a height of the reinforcement wiring pattern is smaller than a height of the pad with reference to the surface of the first insulating layer.

5. The wiring substrate as claimed in claim 1, wherein the reinforcement wiring pattern protrudes from the surface of the first insulating layer.

6. The wiring substrate as claimed in claim 1, wherein the reinforcement wiring pattern is a dummy pattern with no electrical connection.

7. The wiring substrate as claimed in claim 1, wherein a thickness of the reinforcement wiring pattern is equal to a thickness of the pad.

8. The wiring substrate as claimed in claim 1, wherein a coefficient of thermal expansion of the second insulating layer is higher than a coefficient of thermal expansion of the first insulating layer.

9. The wiring substrate as claimed in claim 8, wherein a difference between the coefficient of thermal expansion of the second insulating layer and the coefficient of thermal expansion of the first insulating layer is 10 ppm/° C. or more.

10. The wiring substrate as claimed in claim 1, wherein the reinforcement wiring pattern is partly exposed in the opening of the second insulating layer.

11. The wiring substrate as claimed in claim 1, wherein the reinforcement wiring pattern has an annular shape in the plan view.

12. The wiring substrate as claimed in claim 1, wherein the reinforcement wiring pattern is covered with the second insulating layer on an outer edge side and is exposed in the opening of the second insulating layer on an inner edge side.

13. The wiring substrate as claimed in claim 1, wherein the second insulating layer is a solder resist layer.

14. The wiring substrate as claimed in claim 1, wherein the first insulating layer is exposed between the pad and the reinforcement wiring pattern in the opening of the second insulating layer.

15. The wiring substrate as claimed in claim 11, wherein the annular shape includes a cut to form an incomplete loop in the plan view.

* * * * *